US008839461B2

(12) United States Patent
Fukuma et al.

(10) Patent No.: US 8,839,461 B2
(45) Date of Patent: Sep. 16, 2014

(54) POTENTIAL MEASUREMENT DEVICE AND ATOMIC FORCE MICROSCOPE

(75) Inventors: Takeshi Fukuma, Ishikawa (JP); Naritaka Kobayashi, Ishikawa (JP)

(73) Assignee: National University Corporation Kanazawa University, Ishikawa (JP)

(*) Notice: Subject to any disclaimer, the term of this patent is extended or adjusted under 35 U.S.C. 154(b) by 0 days.

(21) Appl. No.: 14/343,869

(22) PCT Filed: Sep. 12, 2012

(86) PCT No.: PCT/JP2012/005773
§ 371 (c)(1),
(2), (4) Date: Mar. 10, 2014

(87) PCT Pub. No.: WO2013/038659
PCT Pub. Date: Mar. 21, 2013

(65) Prior Publication Data
US 2014/0223614 A1 Aug. 7, 2014

(30) Foreign Application Priority Data

Sep. 12, 2011 (JP) ................................. 2011-198811

(51) Int. Cl.
G01Q 60/30 (2010.01)
G01Q 60/32 (2010.01)
G01Q 10/00 (2010.01)
G01R 29/12 (2006.01)

(52) U.S. Cl.
CPC ................ G01R 29/12 (2013.01); G01Q 10/00 (2013.01)
USPC ................ 850/36; 850/37; 850/33; 250/306; 250/307; 324/72; 324/72.5; 324/457; 324/458; 324/690

(58) Field of Classification Search
USPC ............ 250/306, 307, 526; 324/72, 72.5, 76, 324/77, 109, 158.1, 457, 458, 674, 681, 324/690, 724, 727; 850/1–3, 19, 21, 29, 33, 850/36, 37
See application file for complete search history.

(56) References Cited

U.S. PATENT DOCUMENTS 4,797,620 A * 1/1989 Williams ...................... 324/458
5,666,217 A * 9/1997 Kaneko et al. ................ 349/122

(Continued)

FOREIGN PATENT DOCUMENTS

| JP | 2000-329680 | 11/2000 |
| JP | 2000-346782 | 12/2000 |
| JP | 2002-195927 | 7/2002 |
| JP | 2011-53018 | 3/2011 |

OTHER PUBLICATIONS

International Search Report issued Oct. 9, 2012 in International (PCT) Application No. PCT/JP2012/005773.

(Continued)

Primary Examiner — Bernard E Souw
(74) Attorney, Agent, or Firm — Wenderoth, Lind & Ponack, L.L.P.

(57) ABSTRACT

A device includes: an electrode; a displacement measurement unit outputting voltage corresponding to electrostatic force between the electrode and a sample; a first power supply applying a first voltage between the electrode and sample; a second power supply adding, to the first voltage, a second voltage having a different frequency than the first voltage, and applying the added voltage; and a signal detection unit outputting a particular frequency component's magnitude contained in the displacement measurement unit's output, in which the signal detection unit extracts, from the output by the displacement measurement unit, and outputs, to a potential calculation unit, magnitude and phase of a frequency component of a frequency identical to the frequency of the first voltage, and magnitude of a frequency component of a frequency identical to a frequency equivalent to a difference between the frequencies of the first and second voltages, to measure the sample's surface potential.

5 Claims, 8 Drawing Sheets

(56) References Cited

U.S. PATENT DOCUMENTS

| | | | | |
|---|---|---|---|---|
| 5,742,172 | A * | 4/1998 | Yasutake | 324/750.22 |
| 5,831,705 | A * | 11/1998 | Kaneko et al. | 349/128 |
| 6,741,185 | B2 * | 5/2004 | Shi et al. | 340/853.2 |
| 8,695,108 | B2 * | 4/2014 | Takeshi et al. | 850/19 |
| 2006/0085048 | A1 * | 4/2006 | Cory et al. | 607/48 |
| 2006/0173510 | A1 * | 8/2006 | Besio et al. | 607/45 |
| 2012/0310298 | A1 * | 12/2012 | Besio et al. | 607/45 |

OTHER PUBLICATIONS

M. Nonnenmacher et al., "Kelvin probe force microscopy", Appl. Phys. Lett., 1991, vol. 58, pp. 2921-2923.

Shin'ich Kitamura et al., "High-resolution imaging of contact potential difference with ultrahigh vacuum noncontact atomic force microscope", Applied Physics Letters, 1998, vol. 72, pp. 3154-3156.

Osamu Takeuchi et al., "Kelvin Probe Force Microscopy without Bias-Voltage Feedback", Japanese Journal of Applied Physics, 2007, vol. 46, pp. 5626-5630.

Naritaka Kobayashi et al., "Quantitative potential measurements of nanoparticles with different surface charges in liquid by open-loop electric potential microscopy", J appl. phys., 110, Aug. 25, 2011.

Naritaka Kobayashi et al., "Dual frequency open-loop electric potential microscopy for local potential measurements in electrolyte solution with high ionic strength", Rev.Sci. Instrum, 83, Mar. 30, 2012.

* cited by examiner

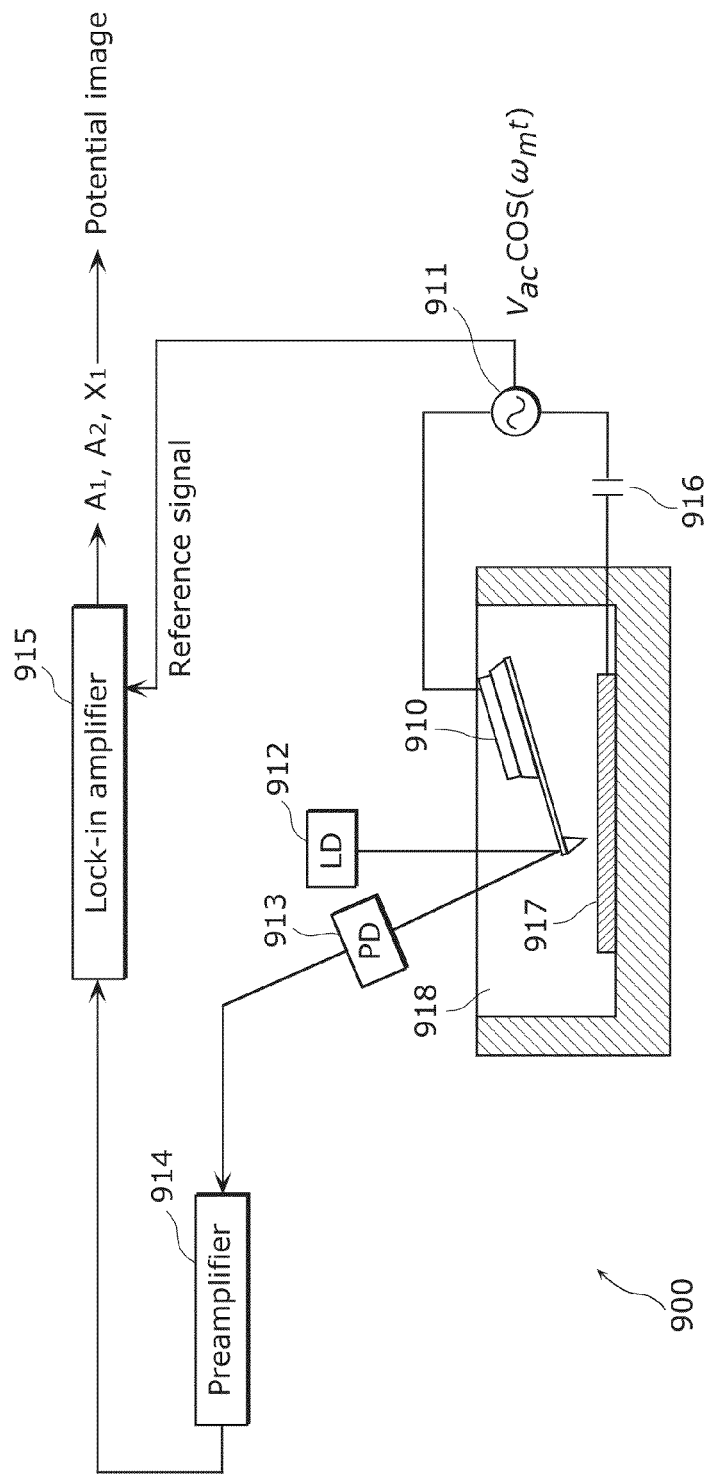

POTENTIAL MEASUREMENT DEVICE AND ATOMIC FORCE MICROSCOPE

CROSS REFERENCE TO RELATED APPLICATIONS

This application is a national phase application of International Patent Application No. PCT/JP2012/005773 filed on Sep. 12, 2012, which claims further priority on Foreign Application 2011-198811 filed on Sep. 12, 2011 in Japan, the entire contents of each of which are incorporated by reference herein.

TECHNICAL FIELD

The present invention relates to potential measurement devices. The present invention relates in particular to a potential measurement device which effectively measures the surface potential of a sample in a liquid.

BACKGROUND ART

An atomic force microscope (hereinafter, referred to as AFM) is a device for obtaining a fine topographic image of the surface of a sample using, as a force detector, a cantilever having a sharp probe at its end (e.g., Patent Literature 1).

Specifically, when the probe is put close to the sample, a force of interaction works between the probe and the sample. When the force of interaction is detected, the vertical position of the probe for the sample is controlled to keep the force of interaction stable. When horizontally scanning the sample in this state, the probe goes up and down along the surface asperities of the sample with a certain distance between the probe and the sample. The AFM obtains a topographic image of the sample surface by recording the path of the probe with respect to a horizontal position.

Two operation modes: (A) static mode and (B) dynamic mode are known in the AFM. The two modes differ in how to detect the force of interaction between the probe and the sample using the cantilever.

The static mode AFM detects the force of interaction between the probe and the sample, based on the displacement of the cantilever caused by the force of interaction between the probe and the sample.

Meanwhile, the dynamic mode AFM detects the force of interaction between the probe and the sample when horizontally scanning the sample while mechanically oscillating the cantilever at a frequency close to the resonance frequency of the cantilever. This detection of the force of interaction is based on a change in oscillation amplitude, frequency, or phase caused by the force of interaction between the probe and the sample.

The method of concurrently measuring the potential distribution of the sample surface and the topographic image of the sample surface, using the AFMs is known (e.g., Non Patent Literature 1).

FIG. 8 is a schematic diagram showing the principle of a kelvin probe force microscopy (hereinafter, referred to as KPFM) generally known as a potential measurement device using the AFM.

As FIG. 8 shows, a KPFM800 includes a cantilever 804, an electrode in a probe shape (hereinafter, referred to as probe electrode) 823, a sample 805, an alternating-current power supply 801, and a direct-current power supply 852.

The cantilever 804 has the sharp probe electrode 823 at its end. One of the ends of the cantilever 804 which has the probe electrode is a free end. Moreover, the other end is a fixed end.

The sample 805 is an object to be measured and placed in the atmosphere or in the vacuum state.

The alternating-current power supply 801 is a power supply which applies an alternating-current bias voltage represented by $V_{ac} \cos(\omega_m t)$ between the probe electrode 823 and the sample 805. Here, $V_{ac}$ is the amplitude of an alternating-current voltage, and $\omega_m$ is the angular frequency of the alternating-current voltage.

The direct-current power supply 852 is a power supply which applies a direct-current bias voltage represented by $V_{dc}$ between the probe electrode 823 and the sample 805.

The distribution of electric charges, polarizations, work functions, and others leads to potential distribution $V_s$ in the surface of the sample 805. Therefore, Expression (1) below determines potential difference $V_{ts}$ between the probe electrode and the sample after the bias voltages are applied by the alternating-current power supply 801 and the direct-current power supply 852.

[Math. 1]

$$V_{ts} = V_{dc} - V_s + V_{ac} \cos(\omega_{n1} t) \quad \text{(Expression 1)}$$

Here, one of the sides of the sample 805 is a front side facing the probe electrode 823. The other side is the back side of the sample 805. Furthermore, the coordinate axis which defines the direction from the back side to the front side as positive is hereinafter referred to as a z axis. Moreover, when $C_{ts}$ represents an electrostatic capacitance between the probe electrode and the sample, an electrostatic force $F_{es}$ working between the probe electrode and the sample is determined by Expression (2) below.

[Math. 2]

$$\begin{aligned} F_{es} &= \frac{1}{2} \frac{\partial C_{ts}}{\partial z} V_{ts}^2 \quad \text{(Expression 2)} \\ &= \frac{1}{2} \frac{\partial C_{ts}}{\partial z} \bigg[ (V_{dc} - V_s)^2 + \frac{1}{2} V_{ac}^2 + 2(V_{dc} - V_s) \\ &\quad V_{ac} \cos(\omega_m t) + \frac{1}{2} V_{ac}^2 \cos^2(2\omega_m t) \bigg] \end{aligned}$$

As Expression (2) shows, $F_{es}$ contains: (i) direct-current components (the first and second terms of the right side of Expression (2)), (ii) $\omega_m$ component of an alternating-current component (the third term of the right side of Expression (2)), and (iii) $2\omega_m$ component of the alternating-current component (the fourth term of the right side of Expression (2)).

Here, $F_{es}$ can be measured as a displacement of the cantilever or a change in the oscillation amplitude, frequency, or phase of the cantilever. Moreover, the KPFM800 detects using a lock-in amplifier (not shown in FIG. 8), only the $\omega_m$ component (i.e., the third term of the right side of Expression (2)) contained in the measured $F_{es}$.

As Expression (2) shows, the $\omega_m$ component is proportional to ($V_{dc} - V_s$). Therefore, if feedback control is performed on $V_{dc}$ so as to cancel the $\omega_m$ component (reduce the $\omega_m$ component to zero), the relationship $V_{dc} = V_s$ always holds. A potential distribution image of the surface of the sample 805 can be obtained by causing the probe electrode 823 to horizontally scan the sample 805 in this state, and recording the value of $V_{dc}$ with respect to the horizontal position of the electrode during the scanning.

As other potential measurement device using the AFM, a scanning Maxwell stress microscopy (hereinafter, referred to as SMM) is known.

The SMM measures a surface potential based on a principle similar to the principle used by the KPFM. Here, the only difference is in how to control the distance between the probe electrode and the sample. The KPFM controls, as with a typical dynamic AFM, the vertical position of the probe electrode 823 so that the change in the oscillation amplitude, frequency, or phase of the cantilever is kept constant. Meanwhile, the SMM controls the vertical position of the probe electrode so that the $2\omega_m$ component (the fourth term of the right side of Expression (2)) caused by the alternating-current bias voltage is kept constant.

CITATION LIST

Patent Literature

[PTL 1] Japanese Unexamined Patent Application Publication No. 2000-346782

Non Patent Literature

[NPL 1] M. Nonnenmacher, M. P. O'Boyle and H. K. Wickramasinghe, Appl. Phys. Lett., 1991, Vol. 58 pp. 2921-2923.
[NPL 2] Shin'ich Kitamura and Masashi Iwatsuki, High-resolution imaging of contact potential difference with ultra-high vacuum noncontact atomic force microscope, Applied Physics Letters, 1998, Vol. 72, pp. 3154-3156.
[NPL 3] Osamu Takeuchi, Yoshihisa Ohrai, Shoji Yoshida, and Hidemi Shigekawa, Kelvin Probe Force Microscopy without Bias-Voltage Feedback, Japanese Journal of Applied Physics, 2007, Vol. 46, pp. 5626-5630.

SUMMARY OF INVENTION

Technical Problem

However, a potential measurement device using an AFM such as the KPFM or SMM applies a direct-current bias voltage and an alternating-current bias voltage between the probe electrode 823 and the sample 805, as described above.

As a result, when the direct-current bias voltage or the alternating-current bias voltage is applied between the probe electrode and the sample, in a liquid, the following problems arise.

(1) The rearrangement of ions in a liquid forms an electrical double layer on the surfaces of the sample or the probe electrode. This cancels an electric field. Therefore, the potential of the sample surface cannot be measured.

(2) The density gradient of a solvent or a solute caused by the rearrangement of ions results in the convection current of the solvent or solute. Therefore, a relaxation time is extremely long (e.g., 10 seconds or longer). This makes it difficult to scan the entire sample in a practical time.

(3) A change in the electrochemical potential of the probe electrode or the sample causes an unnecessary electrochemical reaction. This results in an uncontrollable force of interaction in the probe electrode. Moreover, this significantly influences the physical properties of the surface of the sample to be measured. Furthermore, the rearrangement of ions or an electrochemical reaction appearing near the surface of the cantilever changes a surface energy. This causes a surface stress in the cantilever. This may result in various problems. For example, measurement accuracy is significantly deteriorated.

To solve these problems, an open-loop electric potential microscopy (hereinafter, referred to as OL-EPM) has been suggested.

The OL-EPM can measure the potential of a sample in a liquid with excellent accuracy by applying only a high-frequency alternating-current bias voltage between the electrode and the sample to suppress, in the liquid, an electrochemical reaction and the rearrangement of solvent molecules, solute molecules, ions, and charges.

However, a problem is in that the frequency of a bias voltage which can be applied between the electrode and the sample is limited in the OL-EPM. That is, the potential of the sample is measured by measuring the displacement of the cantilever. However, as will be described later, the displacement sensitivity of the cantilever has a limit. Therefore, by increasing the modulation frequency (modulation angular frequency) $\omega_m$ of an alternating-current bias voltage, the potential of the cantilever cannot be measured in some cases.

In view of these problems, the present invention provides a potential measurement device capable of measuring the potential of a sample by applying a bias voltage having a higher frequency than before.

Solution to Problem

A potential measurement device according to an aspect of the present invention is a potential measurement device for measuring a surface potential of a sample. The potential measurement device includes: an electrode; a displacement measurement unit which outputs a voltage corresponding to an electrostatic force between the electrode and the sample; a first alternating-current power supply which applies a first alternating-current voltage between the electrode and the sample; a second alternating-current power supply which adds, to the first alternating-current voltage, a second alternating-current voltage having a frequency different from a frequency of the first alternating-current voltage, and applies the added voltage between the electrode and the sample; and a signal detection unit which outputs a magnitude of a particular frequency component contained in the voltage outputted by the displacement measurement unit, in which the signal detection unit which extracts, from the voltage outputted by the displacement measurement unit, and outputs, to a potential calculation unit which calculates the surface potential of the sample, (i) a magnitude and a phase of a frequency component of a frequency identical to the frequency of the first alternating-current voltage and (ii) a magnitude of a frequency component of a frequency identical to a frequency equivalent to a difference between the frequency of the first alternating-current voltage and the frequency of the second alternating-current voltage, so that the potential measurement device measures the surface potential of the sample.

According to this configuration, the potential measurement device applies, as a bias voltage, a voltage obtained by superimposing two alternating-current voltages of different frequencies, between the probe electrode and the sample. Moreover, the potential measurement device calculates the surface potential of the sample by using a component corresponding to the difference between the frequencies of the two alternating-current voltages, from a frequency component contained in the displacement signal of the cantilever, instead of the double component of the frequency of an alternating-current voltage. Here, the difference between the two frequencies can be smaller than the double component of one of the frequencies. This allows the potential measurement device to use a higher frequency for the frequency of a bias voltage.

More specifically, the potential measurement device further includes the potential calculation unit which calculates the surface potential of the sample, based on values outputted by the signal detection unit, in which the potential calculation unit may calculate $V_s$ representing the surface potential of the sample by an expression: $V_s=\text{sgn}(x_1) \times G(\omega_1-\omega_2)/G(\omega_1) \times (A_1/A_L) \times (V_2/2)$. Here, $A_1$, which is extracted from the voltage outputted by the displacement measurement unit, represents a magnitude of a frequency component of a frequency identical to $\omega_1$ representing the frequency of the first alternating-current voltage. $x_1$, which is extracted from the voltage outputted by the displacement measurement unit, represents an amount obtained by multiplying $A_1$ by a cosine value of a phase difference between the frequency component of the frequency identical to $\omega_1$ and the first alternating-current voltage. $A_L$, which is extracted from the voltage outputted by the displacement measurement unit, represents a magnitude of a frequency component of a frequency identical to a frequency equivalent to a difference between $\omega_1$ representing the frequency of the first alternating-current voltage and $\omega_2$ representing the frequency of the second alternating-current voltage. $V_2$ represents an amplitude of an alternating-current voltage outputted by the second alternating-current power supply. $G(\omega)$ represents a transfer function of a cantilever having a free end to which the electrode is attached.

This allows the potential calculation unit to specifically calculate the surface potential using (i) the magnitude of a frequency component of the frequency identical to the frequency of the first alternating-current voltage and (ii) the magnitude of a frequency component of the frequency identical to a frequency equivalent to the difference between the frequency of the first alternating-current voltage and the frequency of the second alternating-current voltage. Here, the values of (i) and (ii) are extracted from the voltage outputted by the displacement measurement unit.

Moreover, the sample may be placed in a liquid, and the potential measurement device may measure the surface potential of the sample in the liquid.

This allows the potential measurement device to suppress an unnecessary force of interaction occurring in the electrode, in a solution whose concentration is higher than the solution used in the conventional art. Therefore, the potential measurement device can measure the surface potential of the sample placed in the solution of higher concentration.

Specifically, a frequency of the first alternating-current voltage outputted by the first alternating-current power supply may be at least 10 kHz.

An atomic force microscope according to other aspect of the present invention includes: the potential measurement device; and a position control unit which adjusts a distance between a surface of the sample and the electrode of the potential measurement device so that the distance between the sample and the electrode is kept constant even as time lapses, and outputs an adjustment amount of the distance as information on a height of the sample.

This configuration allows the AFM to apply to the sample, a bias voltage whose frequency is higher than the frequency used in the conventional art. As a result, the AFM can suppress an unnecessary force of interaction occurring in the electrode, in a highly-concentrated solution. Therefore, the AFM can measure the surface shape of the sample placed in the solution of higher concentration.

It should be noted that the present invention is not only achieved as such potential measurement device, but also achieved as a potential measurement method including steps performed by the characteristic methods in the potential measurement device, or achieved as a program for causing a computer to execute such characteristic steps. Such program can be, of course, distributed via a recording medium such as a compact disc read only memory (CD-ROM) and a transmission medium such as the Internet.

Furthermore, the present invention can be achieved as a semiconductor integrated circuit (LSI) which achieves part or all of the functions of the potential measurement device, or as an atomic force microscope (AFM) including the potential measurement device.

Advantageous Effects of Invention

Thus, according to the present invention, it is possible to provide a potential measurement device capable of measuring the potential of a sample by applying a bias voltage having a higher frequency than before.

BRIEF DESCRIPTION OF DRAWINGS

FIG. 1 is a block diagram illustrating the overview of the OL-EPM according to the related art of the present invention.

DESCRIPTION OF EMBODIMENTS

Figure 2A:
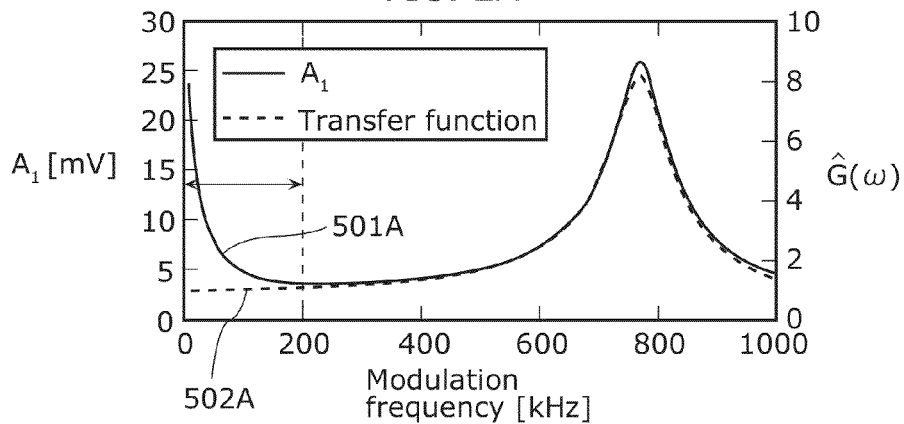
FIG. 2A illustrates the result of measuring the dependency of $A_1$ on $\omega_m$ in an aqueous NaCl solution of 1 mM and the normalized transfer function of the cantilever.

Hereinafter, the embodiments of the present invention are described in greater detail with reference to the accompanying Drawings. It should be noted that each of the exemplary embodiments described below shows a preferable specific example of the present invention. The numerical values, shapes, structural elements, the arrangement and connection of the structural elements, steps, the processing order of the steps, and others shown in the following exemplary embodiments are mere examples. Therefore, the present invention is not limited by each of these embodiments. Among the structural elements in the following exemplary embodiments, structural elements not recited in any one of the independent claims representing superordinate concept are used to form a more preferable embodiment.

With reference to FIG. 1, the following describes the related art of the present invention to more clearly explain the problem of the conventional art.

The inventor(s) et al. of the present application has suggested an open-loop electric potential microscopy (hereinafter, referred to as OL-EPM) to solve the above problem in the potential measurement device which applies a direct-current bias voltage and an alternating-current bias voltage.

The OL-EPM suppresses an electrochemical reaction and the rearrangement of solvent molecules, solute molecules, ions, and charges, which occur in a liquid, by applying only a high-frequency alternating-current bias voltage not less than 10 kHz between an electrode and a sample. Therefore, the OL-EPM can measure the potential of the sample in the liquid with excellent accuracy.

However, the above OL-EPM has the following problem: the frequency of a bias voltage which can be applied between the electrode and the sample is limited. The details will be described below.

The optimum modulation frequency (modulation angular frequency) $\omega_m$, which can suppress an unnecessary force of interaction occurring in a probe due to the unnecessary electrochemical reaction or rearrangement of ions, greatly differs depending on a solution condition. In general, an alternating-current bias voltage having a higher modulation frequency (modulation angular frequency) $\omega_m$ is required for measuring the potential of a sample placed in an electrolyte solution of higher concentration. Here, the OL-EPM measures the potential of the sample by measuring the displacement of a cantilever. However, as will be described later, the displacement sensitivity of the cantilever has a limit. Therefore, when using an extremely high modulation frequency (modulation angular frequency) $\omega_m$, the displacement of the cantilever cannot be measured.

The potential measurement device described below can measure the potential of a sample by applying a bias voltage having a higher frequency than before.

FIG. 1 is a block diagram illustrating the overview of the OL-EPM according to the related art of the present invention.

As FIG. 1 illustrates, an OL-EPM 900 according to the related art measures the surface potential of a sample 917 placed in a solution 918. The OL-EPM 900 includes a cantilever 910, an alternating-current power supply 911, a laser diode (LD) 912, a photodiode (PD) 913, a preamplifier 914, a lock-in amplifier 915, and a capacitor 916.

The alternating-current power supply 911 applies an alternating-current bias voltage between the sample 917 and a probe electrode at one end of the cantilever 910. This alternating-current bias voltage causes an electric field between the probe electrode and the sample 917. In the OL-EPM, the modulation frequency $\omega_m$ of the alternating-current bias voltage is not less than 10 kHz.

Here, an electrostatic force $F_{es}$ occurring between the probe electrode and the sample 917 displaces the end of the cantilever 910 in the direction perpendicular to the sample 917. The OL-EPM 900 measures this displacement using the LD 912 and the PD 913. Specifically, the LD 912 irradiates the end of the cantilever 910 with a semiconductor laser beam, the reflected light of which is received by the PD 913 for detecting a position. The position at which the PD 913 receives light changes according to the displacement of an end portion of the cantilever 910 in the z-axis direction. The OL-EPM 900 extracts this change as the amount of voltage change via the preamplifier 914. Furthermore, the OL-EPM 900 obtains the surface potential of the sample 917 by the lock-in amplifier 915 detecting a particular frequency component in the amount of voltage change.

The capacitor 916 removes a direct-current component from an alternating-current bias voltage. This can effectively suppress, in a liquid, a reaction such as the electrochemical reaction or the rearrangement of solute molecules, solvent molecules, ions, and charges. More specifically, when $V_{ts}=V_s-V_{ac}\cos(\omega_m t)$, $F_{es}$ in the OL-EPM 900 is determined by the following expression.

[Math. 3]

$$F_{es} = \frac{1}{2}\frac{\partial C_{ts}}{\partial z}\left[V_s^2 + \frac{1}{2}V_{ac}^2 - 2V_s V_{ac}\cos(\omega_m t) + \frac{1}{2}V_{ac}^2\cos(2\omega_m t)\right] \quad \text{(Expression 3)}$$

Here, the magnitudes of $\omega_m$ and $2\omega_m$ components in $F_{es}$ are $A_1$ and $A_2$, respectively. $A_1$ and $A_2$ are determined by Expression (4) below using a transfer function $G(\omega)$ of the cantilever 910.

[Math. 4]

$$A_1 = G(\omega_m)\left|\frac{\partial C_{ts}}{\partial z}V_s V_{ac}\right|$$
$$A_2 = G(2\omega_m)\left|\frac{1}{4}\frac{\partial C_{ts}}{\partial z}V_{ac}^2\right| \quad \text{(Expression 4)}$$

Moreover, the transfer function $G(\omega)$ of the cantilever 910 is determined by Expression (5) below.

[Math. 5]

$$G(\omega) = \frac{1}{k}\frac{1}{\sqrt{[1-(\omega/\omega_0)^2]^2 + (\omega/\omega_0 Q)^2}} \quad \text{(Expression 5)}$$

Here, k, $\omega_0(=2\pi f_0)$, and Q respectively represent the spring constant, resonance frequency, and Q value of the cantilever 910.

Moreover, $A_1$ and $A_2$ can be measured by the lock-in amplifier 915. If k, $\omega_0$, and Q are identified, $G(\omega_m)$ and $G(2\omega_m)$ can be calculated by Expression (5). These parameters can be determined by measuring the thermal oscillation spectrum of the cantilever 910, and fitting the spectrum to Expression (6) below.

[Math. 6]

$$n_z = \sqrt{\frac{4k_B T}{\omega_0 k Q}\frac{1}{[1-(\omega/\omega_0)^2]^2 + (\omega/\omega_0 Q)^2} + n_{ds}^2} \quad \text{(Expression 6)}$$

Here, $k_B$, T, and $n_{ds}$ represent the Boltzmann constant, an absolute temperature, and the displacement noise density of a displacement detector, respectively.

The absolute value of $V_s$ can be determined by Expression (7) below using the values in Expression (4).

[Math. 7]
$$|V_s| = \frac{G(2\omega_m)}{G(\omega_m)} \frac{A_1}{A_2} \frac{V_{ac}}{4} \quad \text{(Expression 7)}$$

Here, when a phase difference $\phi$ between $\omega_m$ component in $F_{es}$ and the alternating-current bias voltage is 0 degree (same phase), the sign of $V_s$ is plus. When the phase difference is 180 degrees (reverse phase), the sign of $V_s$ is minus. Ideally, when the lock-in amplifier 915 detects $X_1 = A_1 \cos \phi_1$ and the expression in which $A_1$ in Expression (7) is replaced with $X_1$ is used, the value of $V_s$ can be obtained together with its sign. However, in actual measurement, a noise or a phase delay in a bias circuit, a phase delay due to a dielectric substance between the probe electrode and the sample 917, or other adverse effects may appear. Therefore, $\cos \omega_1$ may be a median value except +1 and -1. This increases an error in a measurement result. Therefore, preferably, the absolute value should be determined by Expression (7), and the sign should be determined from the sign of $X_1$. That is, $V_s$ is obtained by Expression (8).

[Math. 8]
$$V_s = \text{sgn}(X_1) \frac{G(2\omega_m)}{G(\omega_m)} \frac{A_1}{A_2} \frac{V_{ac}}{4} \quad \text{(Expression 8)}$$

When the electrode is horizontally scanning the surface of the sample 917, $X_1$, $A_1$, and $A_2$ are recorded. By so doing, the surface potential image of the sample 917 can be obtained from these values.

However, a problem is in that the OL-EPM 900 cannot measure a potential with excellent accuracy when the concentration of the solution 918 is high.

As described above, in the OL-EPM 900, the modulation frequency $\omega_m$ of the alternating-current power supply 911 is not less than 10 kHz. This can suppress an unnecessary force of interaction occurring in the electrode due to an unnecessary electrochemical reaction and the rearrangement of ions. However, the optimum modulation frequency $\omega_m$ for suppressing the unnecessary force of interaction occurring in the probe electrode greatly differs depending on a solution condition.

Figure 2B:
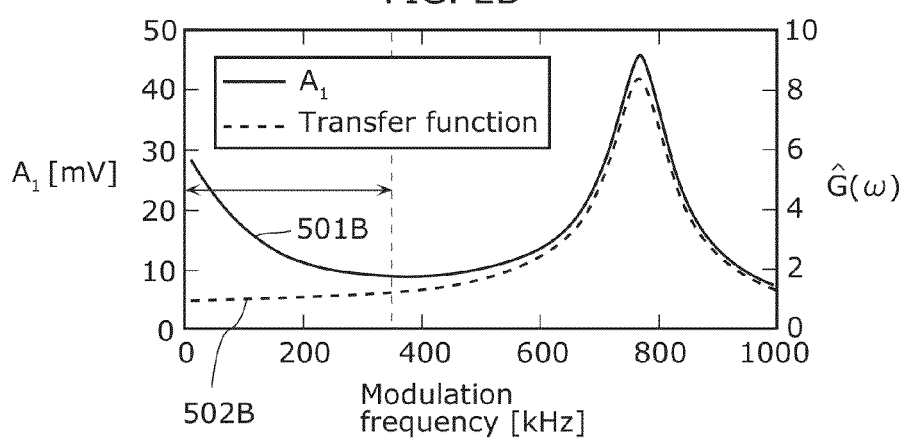
FIG. 2B illustrates the result of measuring the dependency of $A_1$ on $\omega_m$ in an aqueous NaCl solution of 10 mM and the normalized transfer function of the cantilever.
Figure 2C:
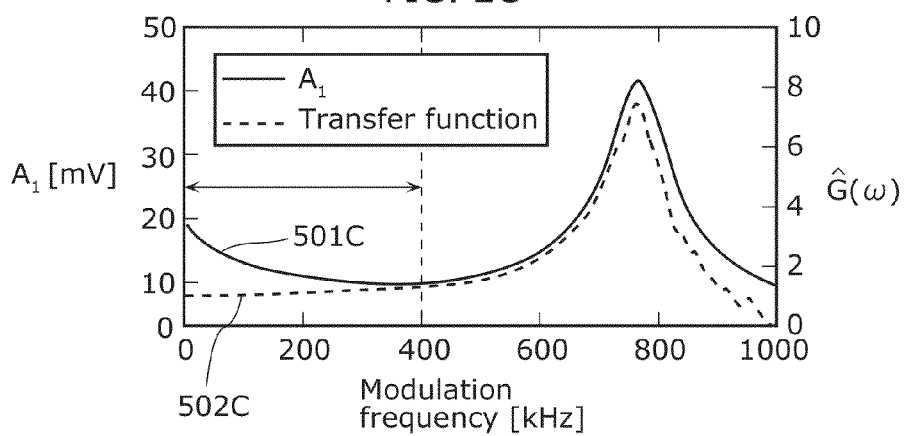
FIG. 2C illustrates the result of measuring the dependency of $A_1$ on $\omega_m$ in an aqueous NaCl solution of 100 mM and the normalized transfer function of the cantilever.

FIGS. 2A to 2C illustrate an example of the result of measuring the dependency of $A_1$ on $\omega_m$ in solutions of different concentrations and the normalized transfer function of the cantilever. More specifically, FIG. 2A illustrates the result of measuring the dependency of $A_1$ on $\omega_m$ in an aqueous NaCl solution of 1 mM (a curve 501A) and the normalized transfer function of the cantilever (a curve 502A), FIG. 2B illustrates the result of measuring the dependency of $A_1$ on $\omega_m$ in an aqueous NaCl solution of 10 mM (a curve 501B) and the normalized transfer function of the cantilever (a curve 502B), FIG. 2C illustrates the result of measuring the dependency of $A_1$ on $\omega_m$ in an aqueous NaCl solution of 100 mM (a curve 501C) and the normalized transfer function of the cantilever (a curve 502C).

It should be noted that the normalized transfer unction of the cantilever is determined by Expression (9).

[Math. 9]
$$\widehat{G}(\omega) = kG(\omega) \quad \text{(Expression 9)}$$

As found in the frequency ranges indicated by the arrows in FIGS. 2A to 2C, $A_1$ has the component of the force of interaction which increases as the frequency decreases. This is an unnecessary force of interaction induced by an electrochemical reaction or the rearrangement of ions or water molecules due to application of a bias voltage. This force of interaction is also seen at a higher frequency with an increase in the concentration of a solution. Therefore, an alternating-current bias voltage having extremely high $\omega_m$ is required for the measurement of a highly concentrated electrolyte solution.

The OL-EPM detects a force of electrostatic interaction as a change in the displacement of the cantilever caused by the force of electrostatic interaction. However, the displacement sensitivity $G(\omega)$ of the cantilever for the force of electrostatic interaction changes depending on $\omega$. As shown by Expression (5), $G(\omega)$ is $1/k$ on the low frequency side, reaches the peak at the resonance frequency of the cantilever, and converges to zero as the frequency increases. Therefore, $\omega_m$ and $2\omega_m$ need to be lower values than the resonance frequency of the cantilever to detect $A_1$ and $A_2$ at a sufficient signal intensity. However, even the highest one of the resonance frequencies of cantilevers on sale is not greater than 1 MHz in an aqueous solution. Moreover, although miniaturization has enabled the production of a prototype cantilever having a high resonance frequency, such cantilever also has a physical limitation. When an alternating-current bias voltage of an extremely high frequency (e.g., not less than 500 kHz) required for measuring a highly concentrated solution is used, $2\omega_m$ largely exceeds the resonance frequency of the cantilever. This makes the detection of $A_2$ significantly difficult. Thus, the OL-EPM 900 cannot measure the surface potential $V_s$ of the sample 917.

To solve the above problems, the following describes a potential measurement device capable of measuring the potential of a sample by applying a bias voltage having a higher frequency than before.

Figure 3:
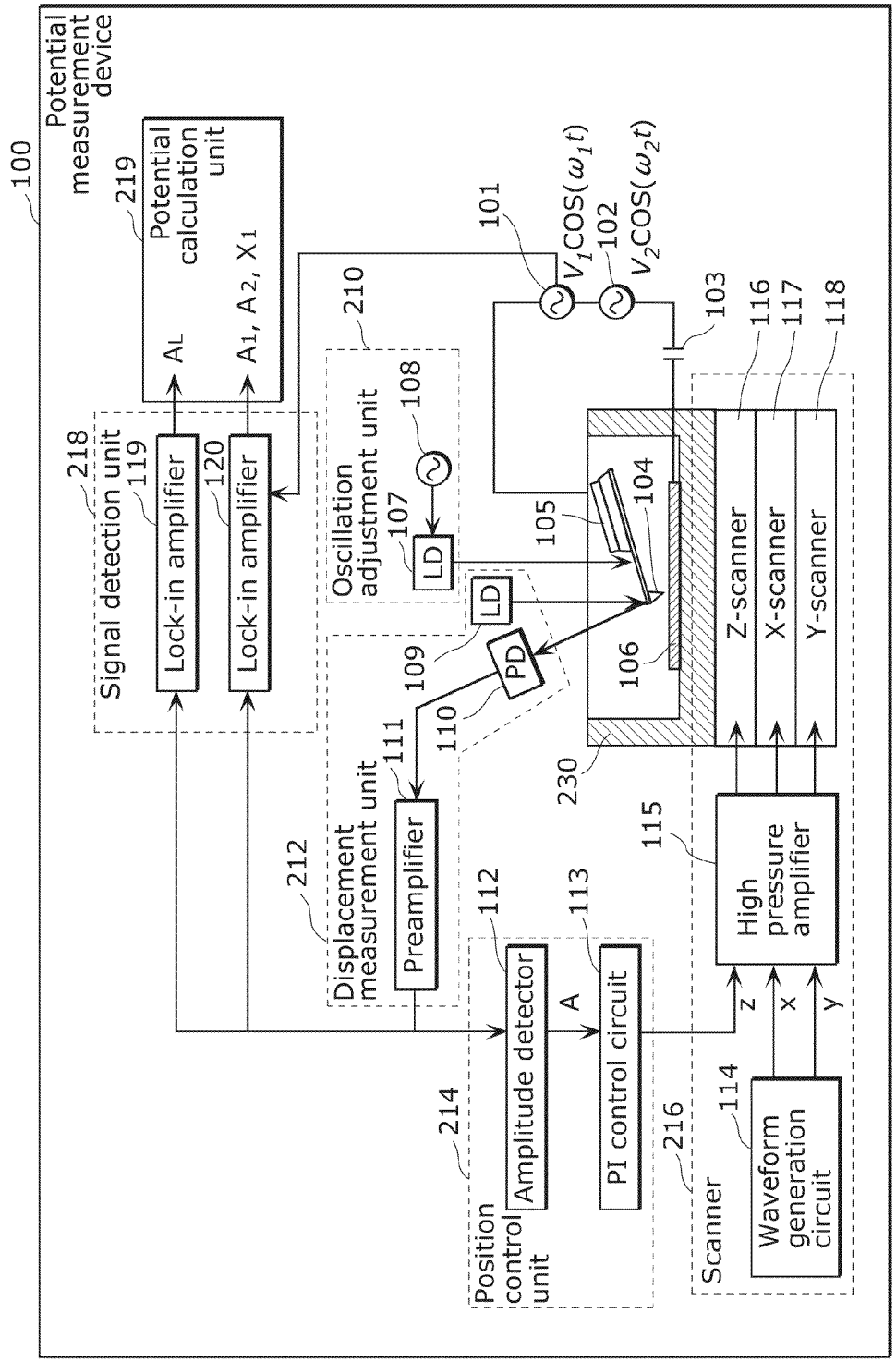
FIG. 3 illustrates a configuration of the potential measurement device according to the embodiment of the present invention.

FIG. 3 illustrates a potential measurement device 100 according to the embodiment of the present invention.

As FIG. 3 illustrates, the potential measurement device 100, which measures the surface potential of a sample 106 in a liquid, includes a first alternating-current power supply 101, a second alternating-current power supply 102, a capacitor 103, a probe electrode 104, a cantilever 105, an oscillation adjustment unit 210, a displacement measurement unit 212, a position control unit 214, a scanner 216, a signal detection unit 218, a potential calculation unit 219, and a sample holder 230.

The first alternating-current power supply 101 applies a first alternating-current voltage $V_1 \cos(\omega_1 t)$ between the probe electrode 104 and the sample 106.

The second alternating-current power supply 102 adds a second alternating-current voltage $V_2 \cos(\omega_2 t)$ to the first alternating-current voltage $V_1 \cos(\omega_1 t)$, and applies the added voltage between the probe electrode 104 and the sample 106. Here, the second alternating-current voltage $V_2 \cos(\omega_2 t)$ has a frequency different from a frequency $\omega_1$ of the first alternating-current voltage $V_1 \cos(\omega_1 t)$. That is, the potential measurement device 100 applies, between the probe electrode 104 and the sample 106, a bias voltage ($V_1 \cos(\omega_1 t) + V_2 \cos(\omega_2 t)$) obtained by superimposing the alternating-current voltages of different frequencies. Here, by setting $V_{ts} = V_s - [V_1 \cos(\omega_1 t) + V_2 \cos(\omega_2 t)]$ in Expression (1), the force of electrostatic interaction $F_{es}$ is determined by Expression (10) below.

[Math. 10]

$$F_{es} = \frac{1}{2}\frac{\partial C_{ts}}{\partial z}[V_s - \{V_1\cos(\omega_1 t) + V_2\cos(\omega_2 t)\}]^2$$
$$= \frac{1}{2}\frac{\partial C_{ts}}{\partial z}\left[\left(V_s^2 + \frac{1}{2}V_s^2 + \frac{1}{2}V_s^2\right) - \right.$$
$$2V_x(V_1\cos(\omega_1 t) + V_2\cos(\omega_2 t)) +$$
$$\frac{1}{2}[V_1^2\cos(2\omega_1 t) + V_2^2\cos(2\omega_2 t)] +$$
$$\left. V_1 V_2[\cos\{(\omega_1 + \omega_2)t\} + \cos\{(\omega_1 - \omega_2)t\}]\right]$$

(Expression 10)

As is clear from Expression (10), $F_{es}$ is proportional to the square of the potential difference between the probe electrode 104 and the sample 106. Therefore, $F_{es}$ contains frequency components. Those components include $\omega_1$-$\omega_2$ component which has a frequency equivalent to the difference of the two frequencies of $\omega_1$ and $\omega_2$. For example, when $\omega_1$=1 MHz+30 kHz and $\omega_2$=1 MHz, $\omega_1$-$\omega_2$=30 kHz. That is, regardless of the values of $\omega_1$ and $\omega_2$, the difference between $\omega_1$ and $\omega_2$ can be a low frequency at which a signal can be detected with sufficient sensitivity.

Even when a high-frequency alternating-current bias voltage is applied, the potential measurement device 100 according to the present embodiment can determine the surface potential $V_s$ of a sample by substituting $\omega_1$-$\omega_2$ component for $2\omega_m$ component (equivalent to the $2\omega_1$ component in Expression (10)) in the OL-EPM.

The capacitor 103 removes a direct-current component which may be contained in a voltage obtained by superimposing voltages supplied from the first alternating-current power supply 101 and the second alternating-current power supply 102.

The probe electrode is composed of an electrically conductive material. Specifically, the probe electrode 104 has a sharp end.

The cantilever 105 has the probe electrode 104 at its end. One of the ends of the cantilever 105 which has the probe electrode is a free end. The other end is a fixed end. Examples of such material include silicon and silicon nitride. It should be noted that a material coated with a conductive metal such as gold or platinum may be used. The following description of the present embodiment is based on the assumption that the cantilever 105 is a silicon cantilever coated with gold.

The oscillation adjustment unit 210 excites the cantilever 105 at a frequency ($f_d$=($\omega_d$; $2\pi$)) near the resonance frequency of the cantilever 105. The oscillation adjustment unit 210 according to the present embodiment excites the cantilever 105 by a photothermal excitation method. More specifically, the oscillation adjustment unit 210 includes an LD 107 and an alternating-current power supply for excitation 108 for driving the LD 107. The LD 107 irradiates, with an intensity-modulated laser beam, the back side of the silicon cantilever 105 coated with gold. Gold and silicon differ in coefficient of thermal expansion. Therefore, the cantilever 105, which has been irradiated with the intensity-modulated laser beam, is excited.

The displacement measurement unit 212 outputs a voltage corresponding to an electrostatic force occurring between the probe electrode 104 and the sample 106. Specifically, the displacement measurement unit 212 measures the displacement of the end of the cantilever 105 in the z-axis direction. The displacement measurement unit 212 measures the electrostatic force $F_{es}$ between the probe electrode 104 and the sample 106, by associating with the displacement of the end of the cantilever 105. The displacement of the end of the cantilever 105 is used in position control to keep the distance between the sample 106 and the probe electrode 104 constant using the scanner 216 which will be described later.

More specifically, the displacement measurement unit 212 includes an LD 109, a PD 110, and a preamplifier 111. The PD 110 of the displacement measurement unit 212 receives the reflected light of a semiconductor laser beam with which the LD 109 has irradiated the end of the cantilever 105. The position at which the PD 110 receives the semiconductor laser beam changes depending on the displacement of the end portion of the cantilever 105 in the z-axis direction. The displacement measurement unit 212 outputs a voltage corresponding to the electrostatic force occurring between the probe electrode 104 and the sample 106, by extracting, via the preamplifier 111, the change in or displacement of this light-receiving position as the amount of voltage change.

The position control unit 214 performs feedback control on the scanner 216 to keep the oscillation amplitude of the cantilever 105 constant. Due to the surface asperities of the sample 106, a change in the distance between the probe electrode 104 and the surface of the sample 106 changes the magnitude of a force of interaction between the probe electrode 104 and the sample 106. This changes the oscillation amplitude of the cantilever 105 which has been excited by the oscillation adjustment unit 210 and is oscillating at a constant amplitude. Therefore, it is possible to keep the distance between the probe electrode 104 and the sample 106 constant by controlling the distance between the electrode 104 and the sample 106 so that the oscillation amplitude of the cantilever 105 is kept constant.

The position control unit 214 includes an amplitude detector 112 and a proportional-integral (PI) control circuit 113. The amplitude detector 112 obtains the displacement of the end portion of the cantilever 105 from the displacement measurement unit 212. Subsequently, the amplitude detector 112 detects the oscillation amplitude of the cantilever 105 from the obtained displacement.

The PI control circuit 113 outputs a control signal for causing the scanner 216 to adjust the height of the sample holder 230 (z-axis direction) so that the amplitude detected by the amplitude detector 112 is kept constant. It should be noted that other feedback control circuit may be used instead of the PI control circuit 113.

It should be noted that the control signal for adjusting the z-axis direction deals with the surface asperities of the sample 106. Therefore, it is possible to measure the physical form of the surface of the sample 106 (information on the height direction) by recording this value.

It should be noted that in the present embodiment, the position control unit 214 may control the distance between the probe electrode 104 and the sample 106 so that an oscillation frequency or a phase, instead of the oscillation amplitude of the cantilever 105, is kept constant.

That is, the position control unit 214 adjusts the distance between the probe electrode 104 and the surface of the sample 106 to be kept constant even as time lapses. Moreover, the adjustment amount of the distance may be outputted as information on the height of the sample 106.

The scanner 216 moves the sample holder 230 by around several nm to dozens of μm in the directions of three axes, i.e., the x, y, and z axes perpendicular to each other. The movement in the z-axis direction is to keep the oscillation frequency of the cantilever 105 constant as described above. The movement in the x-axis and y-axis directions is to measure the physical form and the potential distribution of the surface of the sample 106 consecutively in a plane.

The scanner 216 includes a waveform generation circuit 114, a high pressure amplifier 115, a Z-scanner 116, an X-scanner 117, and a Y-scanner 118.

The Z-scanner 116, the X-scanner 117, the Y-scanner 118 are piezoelectric elements. The Z-scanner 116 moves the sample holder 230 in the z-axis direction. The X-scanner 117 moves the sample holder 230 in the x-axis direction. The Y-scanner 118 moves the sample holder 230 in the y-axis direction.

The potential measurement device 100 amplifies, using the high pressure amplifier 115, a control signal outputted by the position control unit 214 as a result of feedback control (z-axis direction) and signals for scanning in the plane direction generated by the waveform generation circuit 114 (x-axis and y-axis directions). One of the amplified signals is outputted to one of the Z-scanner 116, X-scanner 117, Y-scanner 118, which corresponds to the axis in which the sample holder 230 is to be moved.

The signal detection unit 218 outputs the magnitude of a particular frequency component in a voltage outputted by the displacement measurement unit 212. More specifically, the signal detection unit 218 extracts, from the voltage outputted by the displacement measurement unit 212, and outputs, to the potential calculation unit 219, (i) the magnitude and phase of the frequency component of the frequency identical to the frequency $\omega_1$ of the first alternating-current voltage and (ii) the magnitude of the frequency component of the frequency identical to the frequency equivalent to the difference between the frequency $\omega_1$ of first alternating-current voltage and the frequency $\omega_2$ of the second alternating-current voltage (i.e., $\omega_1-\omega_2$).

The signal detection unit 218 is, specifically, a high sensitive alternating-current voltmeter. For example, a lock-in amplifier or the like can be used as the signal detection unit 218. The signal detection unit 218 according to the present embodiment includes a lock-in amplifier 119 and a lock-in amplifier 120. The signal detection unit 218 uses an alternating-current voltage outputted by the first alternating-current power supply 101 as a reference signal. The signal detection unit 218 detects $X_1$, $A_1$, and $A_L$ from a voltage signal outputted by the displacement measurement unit 212. It should be noted that as will be described later, the potential measurement device 100 does not have to continually detect $X_1$. Moreover, the signal detection unit 218 shown in FIG. 3 also detects $A_2$ for comparative experiments. However, the potential measurement device 100 does not have to detect $A_2$ when measuring the surface potential of the sample 106.

The potential calculation unit 219 calculates the surface potential of the sample 106 from values outputted by the signal detection unit 218. More specifically, the potential calculation unit 219 calculates the surface potential $V_s$ of the sample 106 by Expression: $V_s = \text{sgn}(x_1) \times G(\omega_1-\omega_2)/G(\omega_1) \times (A_1/A_L) \times (V_2/2)$. Here, (1) $A_1$, which is extracted from a voltage outputted by the displacement measurement unit 212, represents the magnitude of the frequency component of the frequency identical to the frequency $\omega_1$ of the first alternating-current voltage. (2) $x_1$, which is extracted from the voltage outputted by the displacement measurement unit 212, represents an amount obtained by multiplying $A_1$ by the cosine value of the phase difference between the frequency component of the frequency identical to $\omega_1$ and the first alternating-current voltage. (3) $A_L$, which is extracted from the voltage outputted by the displacement measurement unit 212, represents the magnitude of the frequency component of the frequency identical to a frequency equivalent to the difference between the frequency $\omega_1$ of the first alternating-current voltage and the frequency $\omega_2$ of the second alternating-current voltage. (4) $V_2$ represents the amplitude of an alternating-current voltage outputted by the second alternating-current power supply. (5) $G(\omega)$ represents the transfer function of the cantilever 105 having a free end to which the probe electrode 104 is attached.

The potential calculation unit 219 may also output the surface potential image of the sample 106 by arranging the calculated surface potentials in relation to the xy plane scanned by the scanner 216.

The following describes a principle when the potential measurement device according to the present invention measures the surface potential of a sample in a liquid. Here, the potential measurement device 100 illustrated in FIG. 3 is used as a specific example.

$A_1$ and $A_L$ are respectively determined by Expressions (11) and (12) below, in view of the transfer function $G(\omega)$ of the cantilever. Here, $A_1$ and $A_L$ respectively represent the magnitude of a $\omega_1$ component in the displacement signal of the cantilever outputted from the displacement measurement unit 212 and the magnitude of $\omega_1-\omega_2$ ($=\omega_L$) component.

[Math. 11]
$$A_1 = G(\omega_1)\left|\frac{\partial C_{ts}}{\partial z} V_s V_1\right| \qquad \text{(Expression 11)}$$

[Math. 12]
$$A_L = G(\omega_L)\left|\frac{\partial C_{ts}}{\partial z} \frac{V_1 V_2}{2}\right| \qquad \text{(Expression 12)}$$

Here, $A_1$, $A_L$, $G(\omega_1)$, and $G(\omega_L)$ can be determined in a similar way to the OL-EPM described above. The potential calculation unit 219 can determine the absolute value of $V_s$ by Expression (13) below, using these values.

[Math. 13]
$$|V_s| = \frac{G(\omega_L)}{G(\omega_1)} \frac{A_1}{A_2} \frac{V_2}{2} \qquad \text{(Expression 13)}$$

Moreover, the sign of $V_s$ can be determined in a similar way to the OL-EPM. Therefore, the potential calculation unit 219 can determine $V_s$ by Expression (14).

[Math. 14]

$$V_s = \text{sgn}(X_1) \frac{G(\omega_L)}{G(\omega_1)} \frac{A_1}{A_L} \frac{V_2}{2} \quad \text{(Expression 14)}$$

It should be noted that $X_1$ is necessary only for identifying the sign of $V_s$. Therefore, the measurement at all positions of the surface of the sample 106 is unnecessary. For instance, when the polarity of the potential difference between the surface of the sample 106 and the probe electrode 104 is not reversed in the entire surface of the sample 106, the signal detection unit 218 may measure $X_1$ only at any one position. After identifying the sign of the measured $X_1$ once, the potential calculation unit 219 can determine the sign of $V_s$ at all measuring points.

The sample holder 230 is a jig for fixing the sample 106 whose potential is to be measured. The sample holder 230, in which the sample 106 is placed, is filled with liquid.

In the above configuration, the potential measurement device 100 according to the present embodiment applies, as a bias voltage, a voltage obtained by superimposing two alternating-current voltages of different frequencies, between the probe electrode 104 and the sample 106. Moreover, the potential measurement device 100 calculates the surface potential of the sample 106 by using a component corresponding to the difference between the frequencies of the two alternating-current voltages, from a frequency component contained in the displacement signal of the cantilever 105, instead of the double component of the frequency of an alternating-current voltage. Here, the difference between the two frequencies can be smaller than the double component of one of the two frequencies. This allows a bias voltage to have a higher frequency in the potential measurement device 100. As a result, an unnecessary force of interaction occurring in the probe electrode 104 can be better suppressed than before in a solution of higher concentration. Therefore, the potential measurement device 100 according to the present embodiment can measure the surface potential of the sample 106 placed in the solution of higher concentration.

Figure 4:
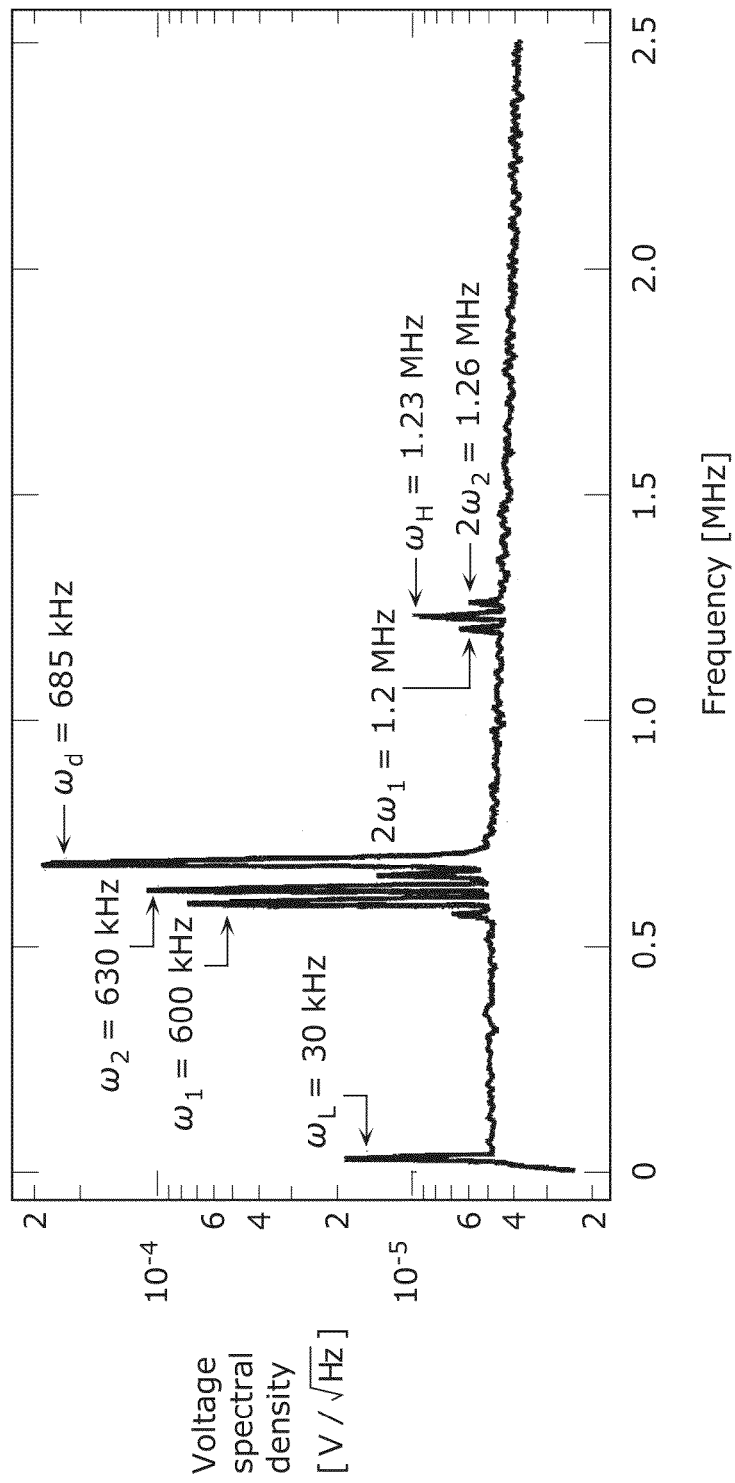
FIG. 4 illustrates the distribution of the voltage spectral density of the displacement signal of the cantilever outputted by the displacement measurement unit according to the embodiment.

With reference to FIG. 4, the following describes the result of the frequency analysis of a displacement signal of the cantilever 105 in the potential measurement device 100.

FIG. 4 illustrates the distribution of the voltage spectral density of the displacement signal of the cantilever 105 outputted by the displacement measurement unit 212 according to the present embodiment. The horizontal axis is the frequency [MHz] while the vertical axis is the voltage spectral density [V/√Hz].

Specifically, $\omega_1$=600 kHz and $\omega_2$=630 kHz so that the frequency component of $A_L$ is a low frequency. Moreover, the potential of a highly oriented pyrolytic graphite (HOPG) substrate placed in an aqueous NaCl solution of 1 mM was measured.

In FIG. 4, the highest peak seen at 685 kHz is caused since the oscillation adjustment unit 210 excites the cantilever 105 near a resonance frequency using the photothermal excitation method, to control the distance between the probe electrode 104 and the sample 106. On its left side, peaks are seen at 600 kHz and 630 kHz. Moreover, peaks are also seen at 1.2 MHz and 1.26 MHz which are respectively the double waves of these frequencies. However, the peaks of these double waves are significantly lower than the peaks at 600 kHz and 630 kHz. Furthermore, peaks are also seen at 30 kHz which is the difference between 600 kHz and 630 kHz and at 1.23 MHz which is the sum of 600 kHz and 630 kHz. The amplitude of $2\omega_1$ component of 1.2 MHz is around one third of the amplitude of $\omega_L$ component of 30 kHz.

In view of the above, to detect the signal representing $\omega_L$ component in the present embodiment is easier than to detect the signal representing $2\omega_1$ component in the conventional art.

With reference to FIGS. 5A to 5D, the following describes the result of measuring, in the aqueous NaCl solution of 1 mM, the dependency of a force of electrostatic interaction on a distance, using the potential measurement device 100 according to the present embodiment. It should be noted that although unnecessary in measuring the potential by the potential measurement device 100 according to the present embodiment, $A_2$ was measured in comparison with the conventional art.

Figure 5A:
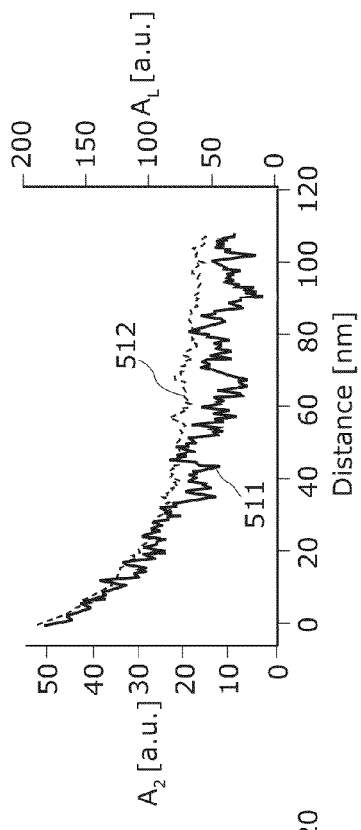
FIG. 5A illustrates the result of measuring the dependency of $A_1$ on the distance.
Figure 5B:
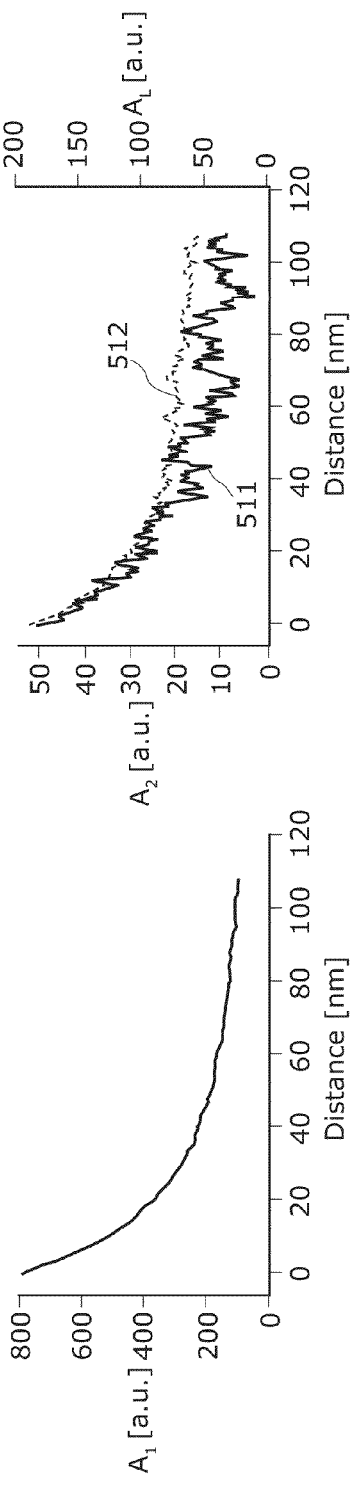
FIG. 5B illustrates the result of measuring the dependency of $A_2$ and $A_L$ on the distance.

FIG. 5A illustrates the result of measuring the dependency of $A_1$ on the distance. FIG. 5B illustrates the result of measuring the dependency of $A_2$ and $A_L$ on the distance. More specifically, a curve 511 represents the value of $A_2$. Moreover, a curve 512 represents the value of $A_L$. It should be noted that in FIGS. 5A and 5B, the horizontal axis represents the distance [nm] between the probe electrode 104 and the sample 106.

Moreover, it is possible to determine $V_s$ from $A_1$ and $A_2$ measured by the potential measurement device 100, by using an expression obtained by substituting $\omega_1$ and $V_1$ for $\omega_m$ and $V_{ac}$ in Expression (7), respectively. Therefore, FIG. 5C illustrates the result of comparing the value of $V_s$ obtained from $A_1$ and $A_2$ using Expression (7) and the value of $V_s$ obtained from $A_1$ and $A_L$ using Expression (13).

Figure 5C:
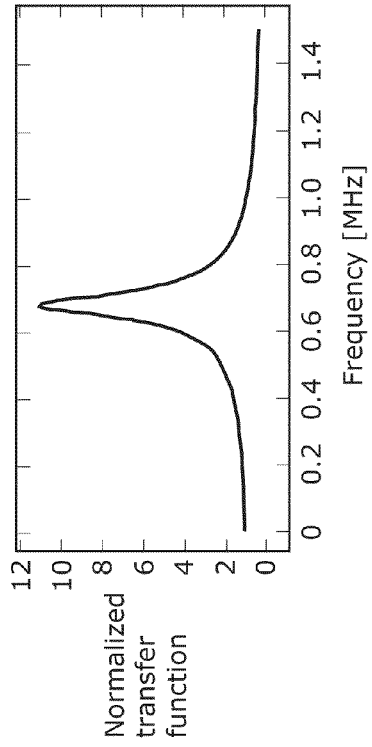
FIG. 5C illustrates the result of the comparison between the value of V obtained from $A_1$ and $A_2$ and the value of $V_s$ obtained from $A_1$ and $A_L$.

A curve 513 in FIG. 5C represents the value of $V_s$ obtained from $A_1$ and $A_2$. Moreover, a curve 514 represents the value of $V_s$ obtained from $A_1$ and $A_L$. It should be noted that in FIG. 5C, the horizontal axis represents the distance [nm] between the probe electrode 104 and the sample 106. A noise in the curve 514 is significantly smaller than a noise in the curve 513. Therefore, it is understood that also in potential measurement in a liquid of high concentration requiring the application of a high-frequency alternating-current bias voltage, the potential measurement device 100, which obtains $V_s$ from $A_1$ and $A_L$, can measure more accurately than the conventional art, which uses $A_1$ and $A_2$.

Figure 5D:
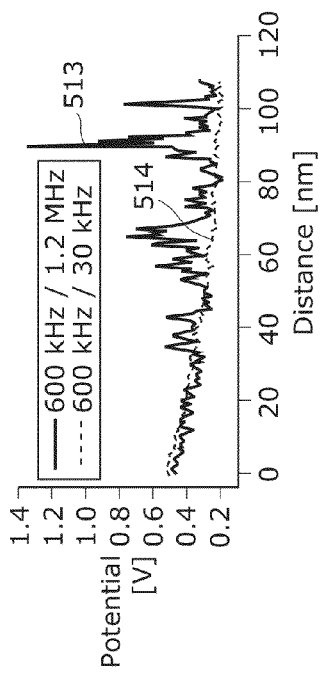
FIG. 5D illustrates the normalized transfer function of the cantilever calculated from the Q value and the resonance frequency of the cantilever.

It should be noted that FIG. 5D illustrates the normalized transfer function of a cantilever calculated from the Q value and the resonance frequency of the cantilever. In FIG. 5D, the vertical axis represents the value of the normalized transfer function of the cantilever while the horizontal axis represents the frequency [MHz].

Figure 6:
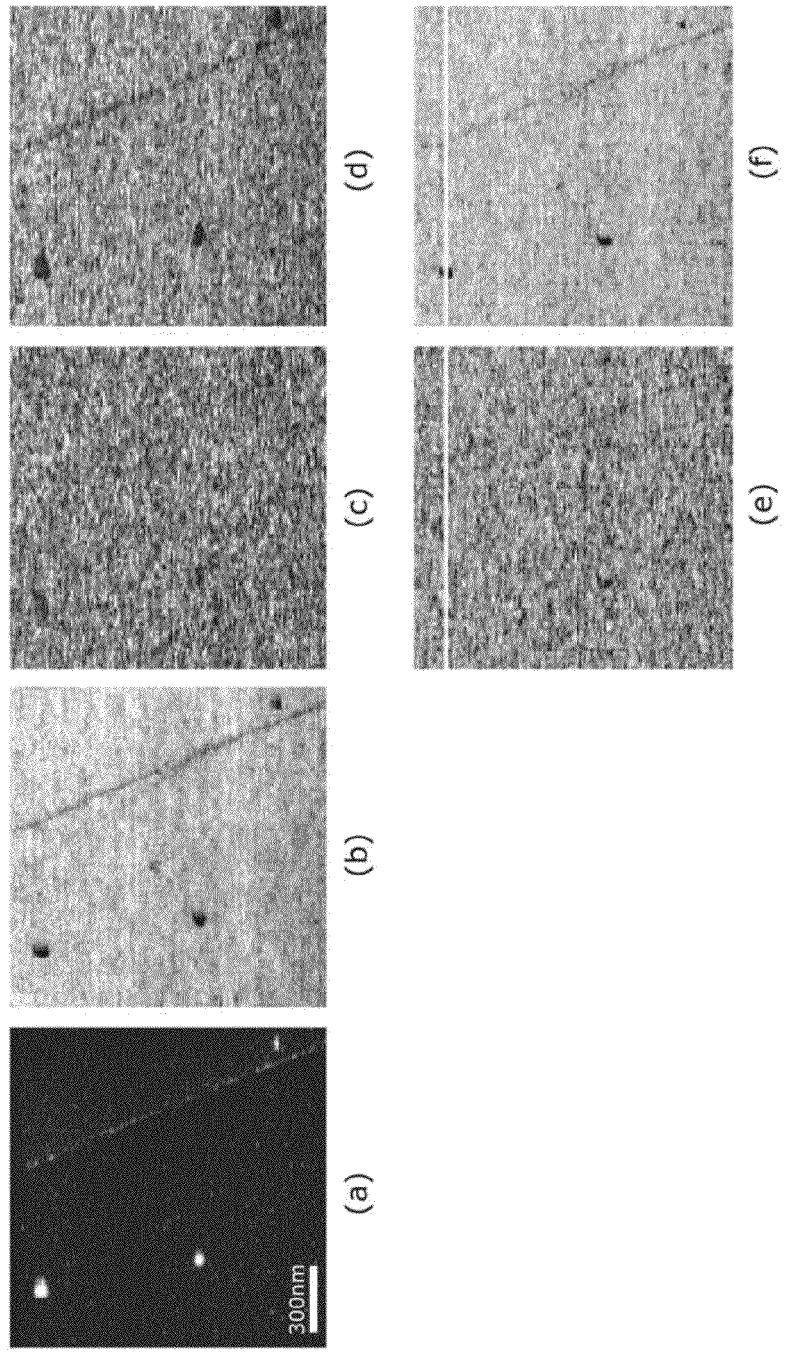
FIG. 6 illustrates the result of measuring the surface potential of the HOPG substrate by the potential measurement device according to the embodiment.
Figure 7A:
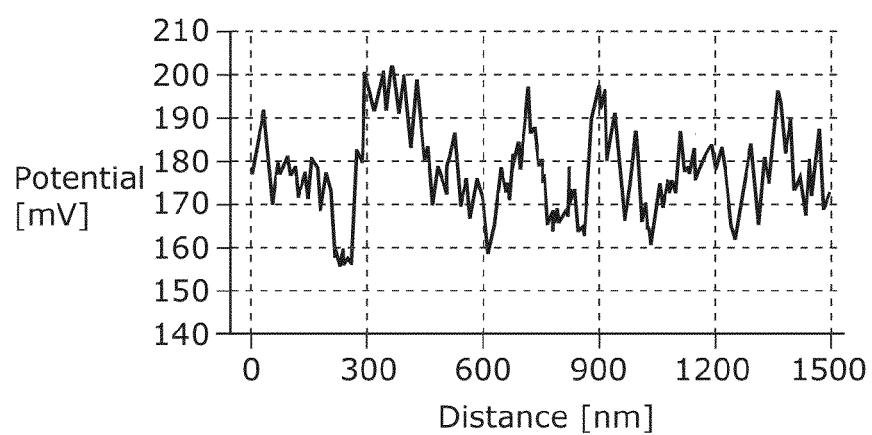
FIG. 7A illustrates the potential profile at the position of the white line shown in (e) in FIG. 6.
Figure 7B:
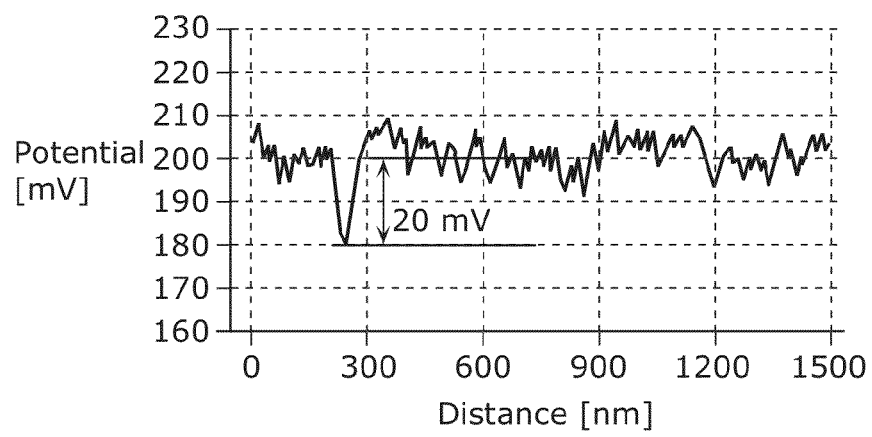
FIG. 7B illustrates the potential profile at the position of the white line shown in (f) in FIG. 6.
Figure 8:
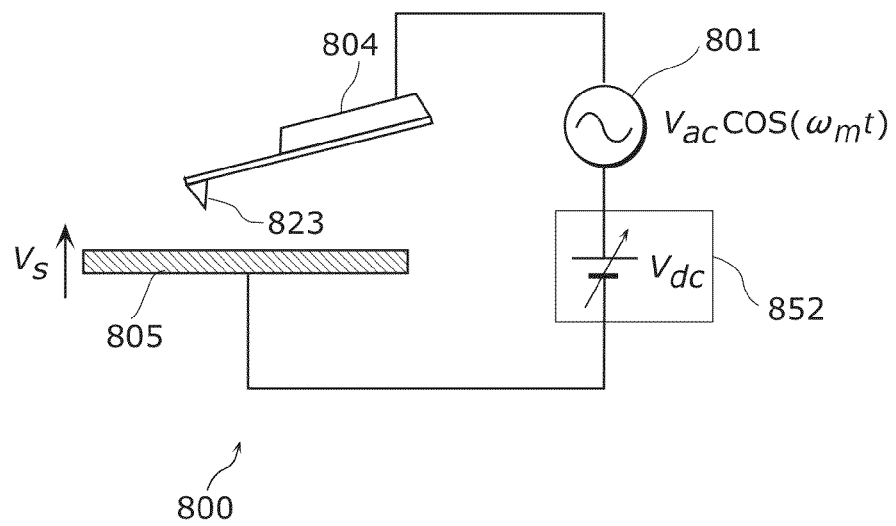
FIG. 8 is a schematic diagram illustrating the principle of a KPFM.

With reference to FIGS. 6, 7A, and 7B, the following describes the result of actually measuring the potential distribution of a sample in a liquid using the potential measurement device 100 according to the present embodiment. Specifically, the following describes the result of measuring, in an aqueous NaCl solution of 10 mM, the surface potential of the HOPG substrate which has adsorbed nanoparticles with positive charges in a neutral solution. Here, the frequencies $\omega_1$ and $\omega_2$ of alternating-current voltages which have been applied between the probe electrode 104 and the sample 106 are 650 kHz and 680 kHz, respectively. Moreover, a resonance frequency $f_0$ of the cantilever is 717 kHz. It should be noted that for comparison, a similar measurement was also performed by the conventional method OL-EPM.

FIG. 6 illustrates the result of measuring the potential surface of the HOPG substrate by the potential measurement device 100. More specifically, (a) in FIG. 6 is the surface shape image of the HOPG substrate. Three nanoparticles adsorbed by the surface of the HOPG substrate are imaged.

Moreover, (b) to (d) in FIG. 6 are respectively an $A_1$ image, an $A_2$ image, and an $A_L$ image of the HOPG substrate captured concurrently with (a) in FIG. 6. Moreover, (e) in FIG. 6 is a potential distribution image of the HOPG substrate obtained from $A_1$ and $A_2$ using Expression (8). Moreover, (f) in FIG. 6 is a potential distribution image of the HOPG substrate obtained from $A_1$ and $A_L$ using Expression (14). Furthermore, FIGS. 7A and 7B illustrate the potential profiles at the positions of the white lines shown in (e) and (f) in FIG. 6. It should be noted that in FIGS. 7A and 7B, the vertical axis represents the potential [mV]. Moreover, the horizontal axis represents the distance [nm] in the horizontal direction parallel to the surface of the HOPG substrate, i.e., the sample 106.

It is understood from FIG. 7A that the potential obtained from $A_1$ and $A_2$ has many noises, and potential differences between the HOPG substrate and a nanoparticles are managed to be identified.

Meanwhile, it is clear from FIG. 7B that the potential obtained from $A_1$ and $A_L$ has a fewer noises, and the potential difference between the HOPG substrate and the nanoparticle is around 20 mV.

It is clear from the result that the potential measurement device 100 according to the present embodiment can measure the surface potential of a sample with excellent accuracy even if a high frequency at which $2\omega_1$ is twice as high as the resonance frequency of the cantilever is used for an alternating-current voltage to measure the potential of the sample placed in a liquid of high concentration.

Although the potential measurement device 100 according to the embodiment of the present invention was described above, the present invention is not limited to the present embodiment.

The potential measurement device 100 according to the present embodiment performs feedback control with the position control unit 214 so that the distance between the probe electrode 104 and the sample 106 and an amplitude change in the cantilever 105 are kept constant. However, in the static mode AFM, the position control unit 214 may perform the feedback control so as to keep the displacement of the cantilever 105 constant. Moreover, in the dynamic mode AFM, the position control unit 214 may perform the feedback control so as to keep the frequency or phase of the oscillation of the cantilever 105 constant. That is, the potential measurement device 100 can use any control system of a distance between the probe electrode 104 and the sample 106, which is used in the static mode AFM and dynamic mode AFM.

Moreover, in the potential measurement device 100 according to the present embodiment, the displacement measurement unit 212 detects an electrostatic force induced by the alternating-current bias voltage, as the displacement of the cantilever 105. However, the displacement measurement unit 212 may detect the electrostatic force induced by the alternating-current bias voltage, from the resonance frequency, oscillation amplitude, or phase of the cantilever 105.

Furthermore, in the potential measurement device 100 according to the present embodiment, the cantilever 105 is used which includes the electrode (probe electrode) 104 in a probe shape for concurrently measuring the surface potential of the sample 106 and height information on the three-dimensional shape of the sample 106. However, the cantilever with the electrode in the probe shape is not necessarily needed for measuring only the surface potential of the sample 106. Instead, an electrode whose size is equivalent to or smaller than the inner diameter of the sample holder 230 may be used, for example.

It should be noted that more precisely, the potential measurement device 100 according to the present embodiment measures potential distribution in a space near the surface of the sample 106. Therefore, to be more precise, the "surface potential" described above means "potential near the surface". However, it can be practically considered as the surface potential of the sample 106. Therefore, the expression "surface potential" is used.

Moreover, in the potential measurement device 100 according to the present embodiment, an alternating-current bias voltage is controlled through the capacitor 103. However, the potential measurement device 100 may be combined with an electrochemical setup which controls the electrochemical potential of the cantilever 105 or the sample 106 by a bipotentiostat, by adding a reference electrode or a counter electrode. In this case, the alternating-current bias voltage can be applied using a bias tee or a transformer. This can measure the potential distribution $V_s$ while stably controlling the electrochemical potential between the probe electrode 104 and the sample 106. Furthermore, it is possible to find dependence, for example, as to how the potential distribution V changes depending on the electrochemical potential of the sample 106.

Moreover, the potential measurement device 100 according to the present embodiment includes the potential calculation unit 219, which calculates a potential image from the measured values of $X_1$, $A_1$, and $A_2$ obtained from the signal detection unit 218. However, the potential measurement device 100 does not necessarily include the potential calculation unit 219. For example, the measured values of $X_1$, $A_1$, and $A_L$ measured by the signal detection unit 218 may be outputted to a device equivalent to the potential calculation unit 219 and provided outside of the potential measurement device 100. This can measure the potential $V_s$ and the potential image by associating with the x, y coordinates at the measurement time. For example, a potential image can be obtained by obtaining two-dimensional images respectively corresponding to $X_1$, $A_1$, and $A_L$ from the measured values of $X_1$, $A_1$, and $A_L$, and inputting the values of points forming each image to the device equivalent to the potential calculation unit 219.

Moreover, the potential measurement device 100 does not necessarily include the capacitor 103, the position control unit 214, and the scanner 216.

Even without the capacitor 103, it is possible to suppress a reaction such as an electrochemical reaction or the rearrangement of solute molecules, solvent molecules, ions, and charges, which will be problems when measuring a potential, by setting the frequencies of alternating-current voltages outputted by the first alternating-current power supply 101 and the second alternating-current power supply 102 to be 10 kHz or higher. Therefore, a similar advantage of the invention can be achieved even without the capacitor 103. However, the inclusion of the capacitor 103 can better prevent a direct-current voltage from being applied. This can suppress a reaction in a liquid and improve measurement accuracy.

Moreover, it is possible to measure a potential at one point on the surface of the sample 106 even without the scanner 216, and the advantage of the invention as a potential measurement device can be achieved. It should be noted that the inclusion of the scanner 216 enables scanning in the x-y plane and the measurement of a potential. Furthermore, the inclusion of the position control unit 214 enables the obtainment of information on the height direction of the sample 106. Therefore, the potential measurement device 100 can be used as an AFM capable of measuring the surface shape of a sample placed in a liquid of high concentration.

It should be noted that the frequencies of the voltages from the first alternating-current power supply 101 and the second alternating-current power supply 102 are not necessarily 10 kHz or higher. However, the higher the frequencies are, it is possible to better suppress a reaction such as an electrochemical reaction or the rearrangement of solute molecules, solvent molecules, ions, and charges, which will be problems when measuring a potential. Therefore, preferably, the frequencies should be 10 kHz or higher.

Moreover, as long as the values of the frequencies $\omega_1$ and $\omega^2$ of alternating-current bias voltages are values less than the resonance frequency of the cantilever, those values may be appropriately changed without being limited to the above-mentioned value. For instance, when the concentration of a solution is high, the measurement accuracy can be improved by increasing the values of $\omega_1$ and $\omega_2$.

It should be noted that in the above embodiment, the potential measurement device 100 measures the potential of the sample in the liquid. However, the sample does not have to be placed in the liquid. That is, the potential measurement device 100 can also measure the potential of a sample placed in any environment such as in the atmosphere, in a liquid, or in a vacuum.

The advantage of using the potential measurement device 100 according to the above embodiment when measuring the surface potential of the sample placed in the liquid was described in the above. Meanwhile, the advantage of measuring the surface potential of the sample placed in the vacuum or in the atmosphere, using the potential measurement device 100 according to the embodiment is in that the potential of the sample can be measured using a high frequency without applying a direct-current voltage. That is, the potential measurement device 100 can apply a given direct-current voltage including zero bias to measure the surface potential of the sample placed in the vacuum or in the atmosphere, using the high frequency. When measuring, in particular, the surface of a semiconductor material, this has a merit similar to that obtained when measuring a sample in a liquid.

It should be noted that each processing unit in the potential measurement device 100 according to the above embodiment is typically achieved as large scale integration (LSI) which is an integrated circuit. These processing units may be achieved as an individual one chip or may be integrated into one chip to include a part or all of the units.

Although the above refers to LSI, it may be referred to as IC, system LSI, super LSI, or ultra LSI according to the degree of integration.

Moreover, circuit integration is not only achieved by LSI, but also may be achieved by a dedicated circuit or a general purpose processor. A field programmable gate array (FPGA) which can be programmed after manufacturing the LSI or a reconfigurable processor which can reconfigure connections or settings in circuit cells in the LSI.

Furthermore, the advent of a new technology for circuit integration, which will replace the LSI, with advancement of the semiconductor technology or development of a derivative technology, may, of course, enable the integration of processing units.

Moreover, part or all of the functions of the potential measurement device 100 according to the above embodiment may be achieved by a processor such as a CPU or the like executing a program.

Furthermore, the present invention may be the above program or a recording medium having the above program recorded thereon. Moreover, the above program can be, of course, distributed via a transmission medium such as the Internet.

Moreover, the connections between structural elements are exemplified to specifically explain the present invention, and the connections for achieving the functions of the present invention are not limited to the above connections.

Furthermore, the present invention also includes various modifications obtained by making changes, which those skilled in the art would conceive, to the present embodiment unless the modifications depart from the scope of the present invention.

INDUSTRIAL APPLICABILITY

The present invention is applicable to potential measurement devices and others, and particularly applicable to a potential measurement device for measuring the surface potential of a sample in a liquid.

REFERENCE SIGNS LIST 100 potential measurement device
101 first alternating-current power supply
102 second alternating-current power supply
103, 916 capacitor
104, 823 probe electrode (electrode)
105, 804, and 910 cantilever
106, 805, and 917 sample
107, 109, 912 LD
108 alternating-current power supply for excitation
110, 913 PD
111, 914 preamplifier
112 amplitude detector
113 PI control circuit
114 waveform generation circuit
115 high pressure amplifier
116 Z-scanner
117 X-scanner
118 Y-scanner
119, 120, 915 lock-in amplifier
210 oscillation adjustment unit
212 displacement measurement unit
214 position control unit
216 scanner
218 signal detection unit
219 potential calculation unit
230 sample holder
501A, 502A, 501B, 502B, 501C, 502C, 511, 512, 513, 514 curve
800 KPFM
801, 911 alternating-current power supply
852 direct-current power supply
900 OL-EPM
918 solution

The invention claimed is:

1. A potential measurement device for measuring a surface potential of a sample, the potential measurement device comprising:
an electrode;
a displacement measurement unit configured to output a voltage corresponding to an electrostatic force between the electrode and the sample;
a first alternating-current power supply which applies a first alternating-current voltage between the electrode and the sample;
a second alternating-current power supply which adds, to the first alternating-current voltage, a second alternating-current voltage having a frequency different from a frequency of the first alternating-current voltage, and applies the added voltage between the electrode and the sample; and a signal detection unit configured to output a magnitude of a particular frequency component contained in the voltage outputted by the displacement measurement unit, wherein the signal detection unit is configured to extract, from the voltage outputted by the displacement measurement unit, and output, to a potential calculation unit configured to calculate the surface potential of the sample, (i) a magnitude and a phase of a frequency component of a frequency identical to the frequency of the first alternating-current voltage and (ii) a magnitude of a frequency component of a frequency identical to a frequency equivalent to a difference between the frequency of the first alternating-current voltage and the frequency of the second alternating-current voltage, so that the potential measurement device measures the surface potential of the sample.

2. The potential measurement device according to claim 1, further comprising the potential calculation unit configured to calculate the surface potential of the sample, based on values outputted by the signal detection unit, wherein the potential calculation unit is configured to calculate $V_s$ representing the surface potential of the sample by an expression:

$$V_s = sgn(x_1) \times G(\omega_1-\omega_2)/G(\omega_1) \times (A_1/A_L) \times (V_2/2),$$

where $A_1$, which is extracted from the voltage outputted by the displacement measurement unit, represents a magnitude of a frequency component of a frequency identical to $\omega_1$ representing the frequency of the first alternating-current voltage, $x_1$, which is extracted from the voltage outputted by the displacement measurement unit, represents an amount obtained by multiplying $A_1$ by a cosine value of a phase difference between the frequency component of the frequency identical to $\omega_1$ and the first alternating-current voltage, $A_L$, which is extracted from the voltage outputted by the displacement measurement unit, represents a magnitude of a frequency component of a frequency identical to a frequency equivalent to a difference between $\omega_1$ representing the frequency of the first alternating-current voltage and $\omega_2$ representing the frequency of the second alternating-current voltage, $V_2$ represents an amplitude of an alternating-current voltage outputted by the second alternating-current power supply, and $G(\omega)$ represents a transfer function of a cantilever having a free end to which the electrode is attached.

3. The potential measurement device according to claim 1, wherein the sample is placed in a liquid, and the potential measurement device measures the surface potential of the sample in the liquid.

4. The potential measurement device according to claim 1, wherein a frequency of the first alternating-current voltage outputted by the first alternating-current power supply is at least 10 kHz.

5. An atomic force microscope comprising:

the potential measurement device according to claim 1; and a position control unit configured to adjust a distance between a surface of the sample and the electrode of the potential measurement device so that the distance between the sample and the electrode is kept constant even as time lapses, and output an adjustment amount of the distance as information on a height of the sample.

* * * * *